(12) United States Patent
Huang et al.

(10) Patent No.: US 8,964,454 B1
(45) Date of Patent: Feb. 24, 2015

(54) THREE-DIMENSIONAL STATIC RANDOM ACCESS MEMORY CELL

(71) Applicant: Taiwan Semiconductor Manufacturing Company Limited, Hsinchu (TW)

(72) Inventors: Chien-Yu Huang, Taoyuan County (TW); Chien-Yuan Chen, Hsinchu (TW); Hau-Tai Shieh, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/071,832

(22) Filed: Nov. 5, 2013

(51) Int. Cl.
  *G11C 11/00* (2006.01)
  *G11C 11/417* (2006.01)
(52) U.S. Cl.
  CPC .................................. *G11C 11/417* (2013.01)
  USPC ................................ 365/154; 365/51; 365/63
(58) Field of Classification Search
  USPC .................................. 365/154, 51, 63, 189.09
  See application file for complete search history.

(56) References Cited

U.S. PATENT DOCUMENTS 7,924,604 B2 * 4/2011 Yang et al. .................... 365/154

* cited by examiner

*Primary Examiner* — David Lam
(74) *Attorney, Agent, or Firm* — Jones Day (57) ABSTRACT

Systems and methods are provided for fabricating a static random access memory (SRAM) cell in a multi-layer semiconductor device structure. The SRAM cell includes two pull-up transistors, two pull-down transistors, a plurality of operation-assistance transistors, and two pass-gate transistors. The first pull-up transistor and the second pull-up transistor are formed in a first device layer of the multi-layer semiconductor device structure. The first pull-down transistor and the second pull-down transistor are formed in a second device layer of the multi-layer semiconductor device structure. The plurality of operation-assistance transistors are formed in the first device layer and configured to provide local supply voltages to the first pull-up transistor and the second pull-up transistor respectively. The first pass-gate transistor and the second pass-gate transistor are formed in the second device layer and configured to provide access to the data bit.

20 Claims, 9 Drawing Sheets

THREE-DIMENSIONAL STATIC RANDOM ACCESS MEMORY CELL

FIELD

The technology described in this disclosure relates generally to electronic devices and more particularly to memory devices.

BACKGROUND

Memory devices are widely used for storing information in modern electronic equipments, such as computers and mobile phones. Static random access memory (SRAM) devices are often popular in certain electronic applications in which high speed, low power consumption and simple operations are needed. A SRAM device often includes a number of memory cells, and each cell may contain multiple transistors.

SUMMARY

In accordance with the teachings described herein, systems and methods are provided for fabricating a static random access memory (SRAM) cell in a multi-layer semiconductor device structure. The SRAM cell includes two pull-up transistors, two pull-down transistors, a plurality of operation-assistance transistors, and two pass-gate transistors. The first pull-up transistor and the second pull-up transistor are formed in a first device layer of the multi-layer semiconductor device structure. The first pull-down transistor and the second pull-down transistor are formed in a second device layer of the multi-layer semiconductor device structure. The plurality of operation-assistance transistors are formed in the first device layer and configured to provide local supply voltages to the first pull-up transistor and the second pull-up transistor. The first pass-gate transistor and the second pass-gate transistor are formed in the second device layer and configured to provide access to the data bit.

In one embodiment, a static random access memory (SRAM) cell fabricated in a multi-layer semiconductor device structure includes a first inverter structure, a second inverter structure, a local-supply-voltage generator, and an access device structure. The first inverter structure includes one or more first pull-up transistors and one or more first pull-down transistors. The second inverter structure includes one or more second pull-up transistors and one or more second pull-down transistors, the first inverter structure and the second inverter structure being cross-coupled for storing a data bit. The local-supply-voltage generator includes one or more operation-assistance transistors and is configured to provide local supply voltages to the first inverter structure and the second inverter structure. The access device structure includes one or more pass-gate transistors and is configured to provide access to the data bit. The first pull-up transistors, the second pull-up transistors, and the operation-assistance transistors are formed in a first device layer of the multi-layer semiconductor device structure. The first pull-down transistors and the second pull-down transistors are formed in a second device layer of the multi-layer semiconductor device structure. The first inverter structure and the second inverter structure are coupled to the access device structure.

In another embodiment, a static random access memory (SRAM) cell fabricated in a multi-layer semiconductor device structure includes: a first pull-up transistor, a second pull-up transistor, a first operation-assistance transistor, a second operation-assistance transistor, a power line, one or more bias voltage lines, a first pull-down transistor, a second pull-down transistor, a first pass-gate transistor, a second pass-gate transistor, a word line, and one or more bit lines. The first pull-up transistor and the second pull-up transistor are formed in a first device layer of the multi-layer semiconductor device structure. The first operation-assistance transistor is formed in the first device layer and is coupled to the first pull-up transistor. The second operation-assistance transistor is formed in the first device layer and is coupled to the second pull-up transistor. The power line is formed in the first device layer and is configured to provide a supply voltage to the first operation-assistance transistor and the second operation-assistance transistor. The bias voltage lines are formed in the first device layer and are configured to provide gate-bias voltages to the first operation-assistance transistor and the second operation-assistance transistor. The first pull-down transistor and the second pull-down transistor are formed in a second device layer of the multi-layer semiconductor device structure, the first pull-up transistor, the second pull-up transistor, the first pull-down transistor and the second pull-down transistor being in cross-coupled inverter configuration for storing a data bit. The first pass-gate transistor and the second pass-gate transistor are formed in the second device layer and are configured to provide access to the data bit. The word line is formed in the second device layer and is configured to provide a word-line signal to the first pass-gate transistor and the second pass-gate transistor. The bit lines are formed in the second device layer and are configured to provide input signals to the first pass-gate transistor and the second pass-gate transistor and receive output signals from the first pass-gate transistor and the second pass-gate transistor.

DETAILED DESCRIPTION

Figure 1:
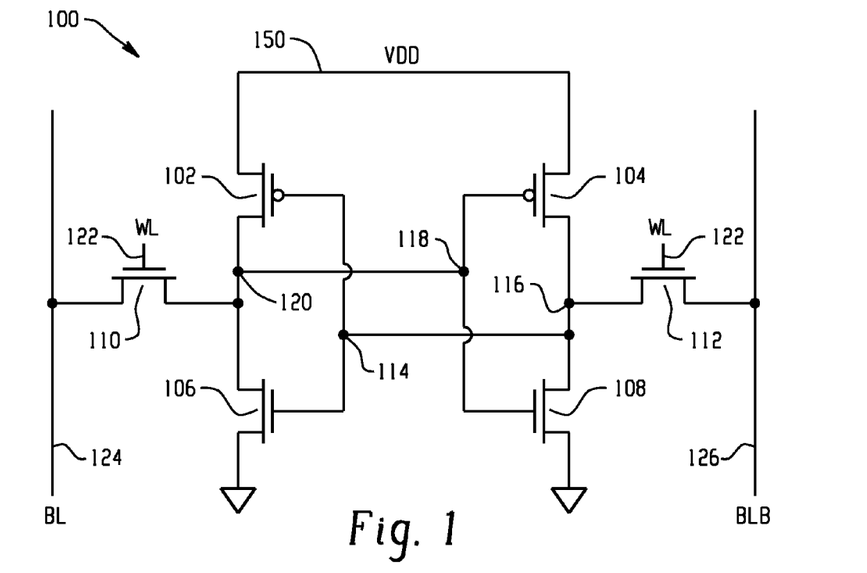
FIG. 1 depicts an example diagram of a six-transistor (6-T) SRAM cell.

FIG. 1 depicts an example diagram of a six-transistor (6-T) SRAM cell. As shown in FIG. 1, the SRAM cell 100 includes two pull-up transistors 102 and 104 (e.g., P-channel transistors), two pull-down transistors 106 and 108 (e.g., N-channel transistors), and two pass-gate transistors 110 and 112 (e.g., N-channel transistors). The transistors 102, 104, 106 and 108 are connected in cross-coupled inverter configuration. That is, the transistors 102 and 106 form a first inverter, and the transistors 104 and 108 form a second inverter. An input terminal 114 of the first inverter is coupled with an output terminal 116 of the second inverter, and an input terminal 118 of the second inverter is coupled with an output terminal 120 of the first inverter. Gate terminals of the pass-gate transistors 110 and 112 are both configured to receive a word-line signal 122. A pair of complementary bit lines 124 and 126 are coupled to source/drain terminals of the pass-gate transistors 110 and 112 respectively.

Usually, the SRAM cell 100 operates in a read mode, a write-enable mode, or a power-down mode (i.e., a data-retention mode). In a read mode, the pass-gate transistors 110 and 112 are turned on in response to the word-line signal 122 to perform a read operation. A data bit stored in the SRAM cell 100 may be read out through the bit lines 124 and 126. In a write-enable mode, a write operation is performed to write a new data bit to the SRAM cell 100 through the bit lines 124 and 126 when the word-line signal 122 turns on the pass-gate transistors 110 and 112. Furthermore, in the power-down mode, the pass-gate transistors 110 and 112 are turned off, and the data bit is stored in the SRAM cell 100.

As shown in FIG. 1, the SRAM cell 100 includes six transistors which often occupy a large area on an integrated circuit chip. In addition, extra power-gating circuits are often needed to control leakage and reduce power consumption in the power-down mode, which may increase system costs. Furthermore, for low power applications, the SRAM cell 100 often operates under a low supply voltage. However, if the supply voltage is too low, the SRAM cell 100 may not perform certain operations (e.g., a write operation) successfully. As the feature size of transistors continues to scale down, providing a sufficiently large supply voltage often becomes a challenge.

Figure 2:
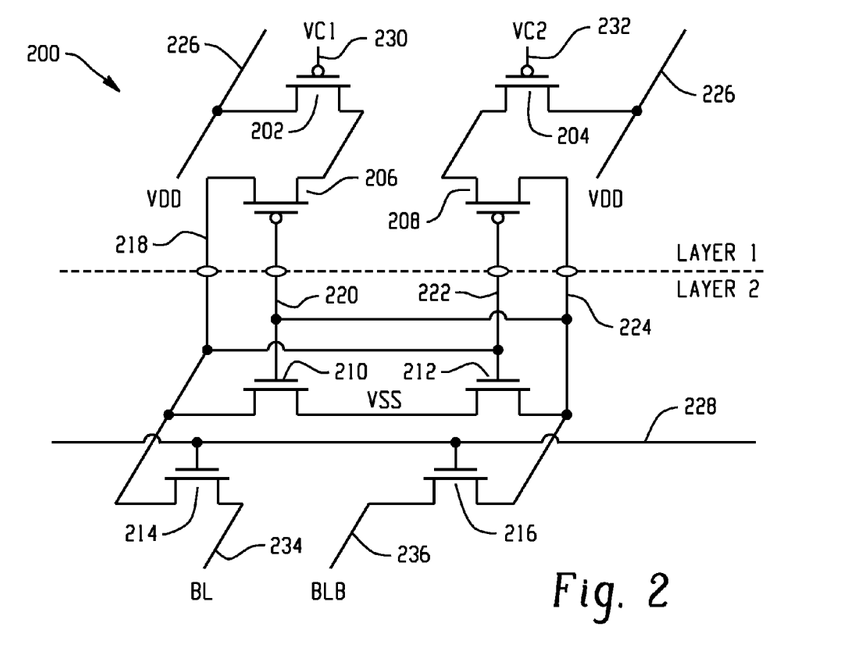
FIG. 2 depicts an example diagram of an eight-transistor (8-T) SRAM cell fabricated using a multi-layer semiconductor device structure.

FIG. 2 depicts an example diagram of an eight-transistor (8-T) SRAM cell fabricated using a multi-layer semiconductor device structure. As shown in FIG. 2, the SRAM cell 200 includes eight transistors 202, 204, 206, 208, 210, 212, 214 and 216. The transistors 202, 204, 206 and 208 (e.g., P-channel transistors) are fabricated in a first device layer ("Layer 1"), and the transistors 210, 212, 214 and 216 (e.g., N-channel transistors) are fabricated in a second device layer ("Layer 2"). Inter-layer connection structures (e.g., vias), such as the connection structures 218, 220, 222, and 224, are fabricated to connect the pull-up transistors 206 and 208 and the pull-down transistors 210 and 212 in cross-coupled inverter configuration.

Gate terminals of the pass-gate transistors 214 and 216 are coupled to a word line 228. A pair of complementary bit lines 234 and 236 are coupled to source/drain terminals of the pass-gate transistors 214 and 216 respectively. A global supply voltage 226 ("VDD") is provided to the operation-assistance transistors 202 and 204 which receive bias voltage 230 ("VC1") and the bias voltage 232 ("VC2") respectively. For example, the bias voltage 230 is equal to the bias voltage 232. In another example, the bias voltage 230 is different from the bias voltage 232. As an example, the bias voltage 230 and the bias voltage 232 are equal to or lower than the global supply voltage 226.

Figure 3:
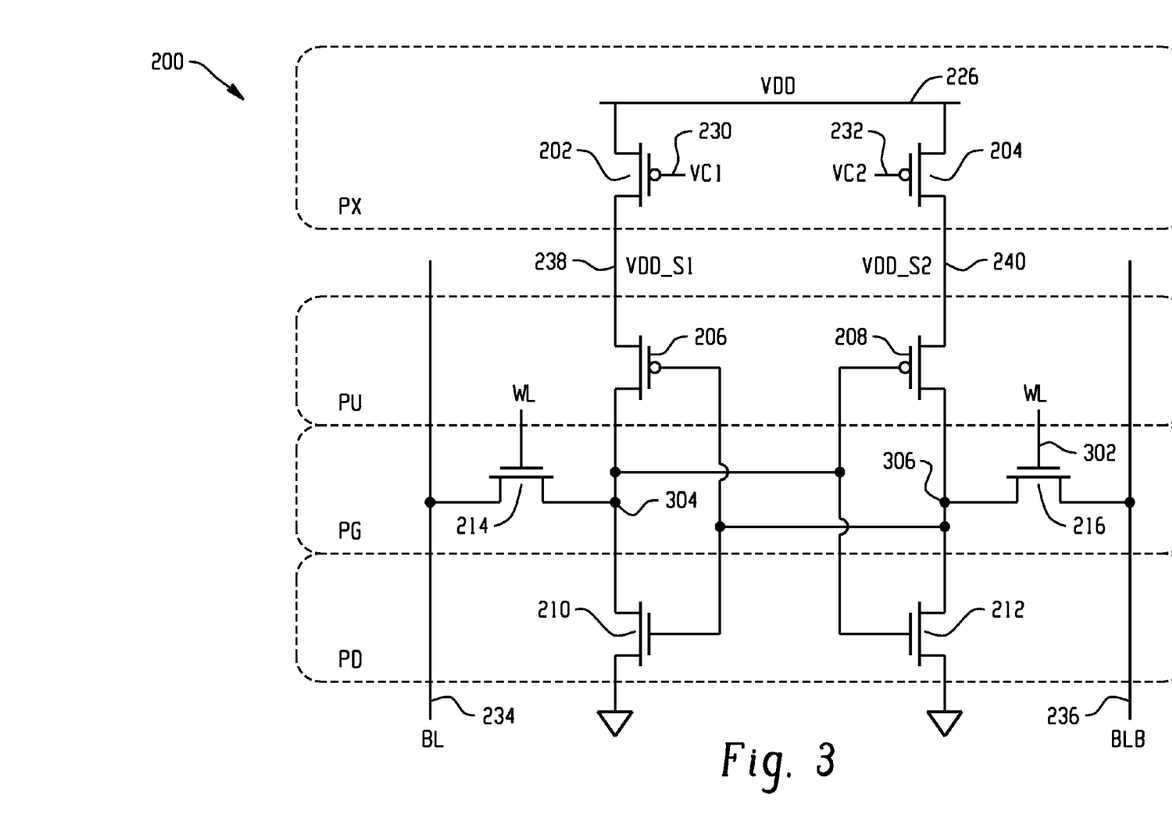
FIG. 3 depicts an example schematic diagram of the SRAM cell as shown in FIG. 2.

FIG. 3 depicts an example schematic diagram of the SRAM cell 200. As shown in FIG. 3, the transistor 202 is configured to provide a local supply voltage 238 ("VDD_S1") to the transistor 206. If the bias voltage 230 that is applied on the gate terminal of the transistor 202 changes, the local supply voltage 238 may change in response. For example, when the transistor 202 is turned on in response to the bias voltage 230 (e.g., at logic low), the local supply voltage 238 decreases in magnitude if the bias voltage 230 increases in magnitude. Likewise, the transistor 204 is configured to provide a local supply voltage 240 ("VDD_S2") to the transistor 208, and the local supply voltage 240 changes with the bias voltage 232.

Figure 4:
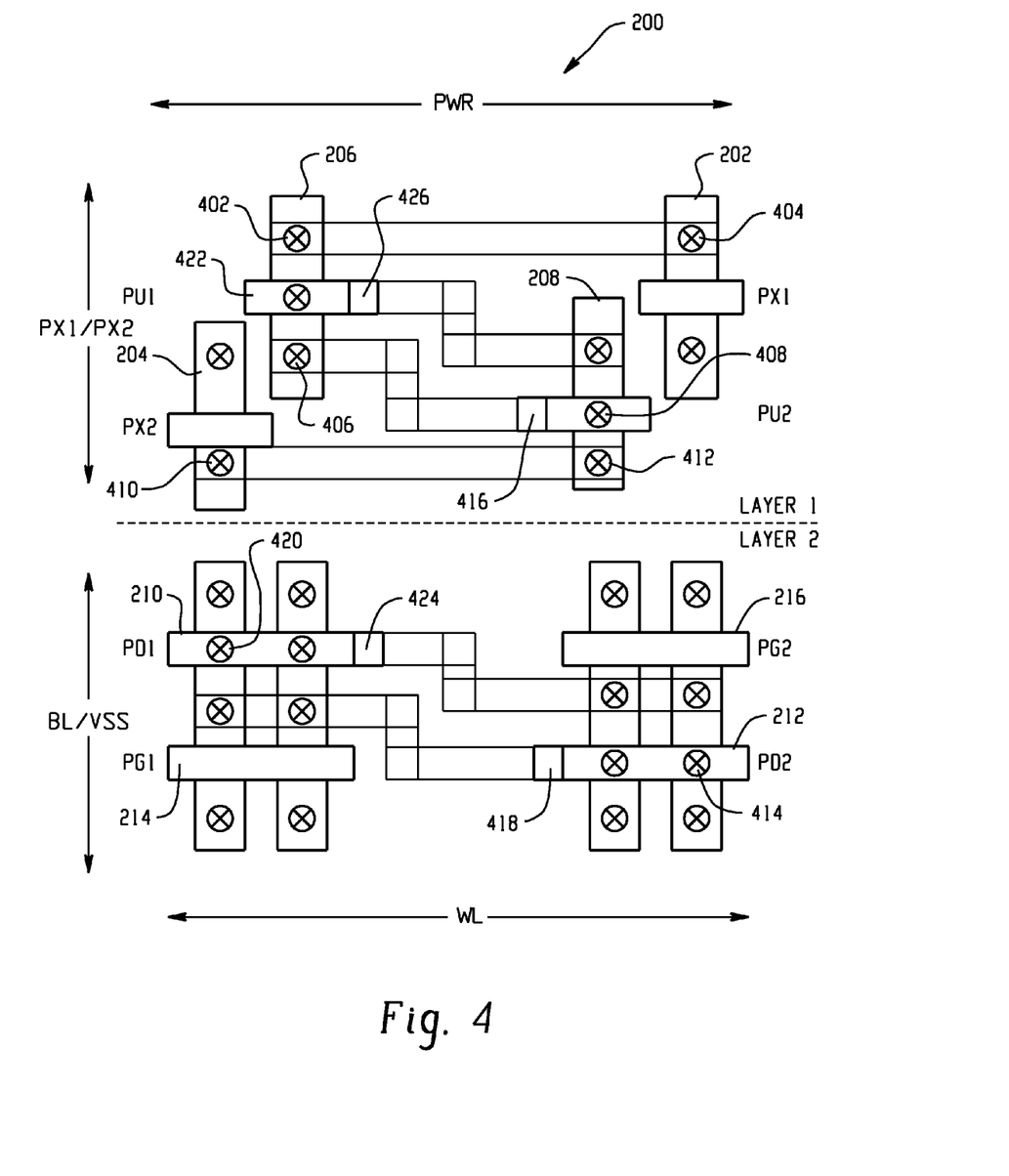
FIG. 4 depicts an example layout diagram of the SRAM cell as shown in FIG. 2.

FIG. 4 depicts an example layout diagram of the SRAM cell 200. As shown in FIG. 4, the first device layer ("Layer 1") includes the transistors 202, 204, 206 and 208 which are interconnected. For example, a source/drain terminal 402 of the transistor 206 ("PU1") is connected to a source/drain terminal 404 of the transistor 202 ("PX1"), and another source/drain terminal 406 of the transistor 206 is connected to a gate terminal 408 of the transistor 208 ("PU2"). A source/drain terminal 410 of the transistor 204 ("PX2") is connected to another source/drain terminal 412 of the transistor 208.

The second device layer ("Layer 2") includes the transistors 210, 212, 214 and 216 which are also interconnected. As an example, a gate terminal 414 of the transistor 212 ("PD2") is connected to the gate terminal 408 of the transistor 208 ("PU2") through one or more inter-layer connection structures (e.g., vias 416 and 418). A gate terminal 420 of the transistor 210 ("PD1") is connected to a gate terminal 422 of the transistor 206 ("PU1") through one or more inter-layer connection structures (e.g., vias 424 and 426).

In some embodiments, a conductive line ("PWR") corresponding to the global supply voltage 226 ("VDD") is fabricated in the first device layer ("Layer 1"). One or more conductive lines ("PX1/PX2") corresponding to the bias voltage 230 ("VC1") and/or the bias voltage 232 ("VC2") are fabricated in the first device layer ("Layer 1"). One or more conductive lines ("BL/VSS") corresponding to the bit line 234, the bit line 236 and/or a global bias voltage "VSS" are fabricated in the second device layer ("Layer 2"). A conductive line ("WL") corresponding to the word line 228 is also fabricated in the second device layer ("Layer 2"). For example, the conductive line "PWR" is along a same direction as the conductive line "WL." The conductive lines "PX1/PX2" are along a same direction as the conductive lines "BL/VSS."

Referring to FIG. 2 and FIG. 3, the SRAM cell 200 may be in a normal-operation mode, e.g., a read mode, or a write-enable mode. In some embodiments, when the SRAM cell 200 is in a read mode, the transistors 202 and 204 are turned on in response to the bias voltages 230 and 232 (e.g., both at logic low) respectively. A word-line signal 302 turns on the pass-gate transistors 214 and 216. A data bit stored in the SRAM cell 200 may be transferred to the bit lines 234 and 236. For example, if a node 304 holds a logic value "0" and a node 306 holds a logic value "1," the bit line 234 may be discharged through the pass-gate transistor 214 and the pull-down transistor 210 to have the logic value "0," and the bit line 236 may be pulled to the logic value "1" through the pass-gate transistor 216 and the pull-up transistor 208.

Figure 5:
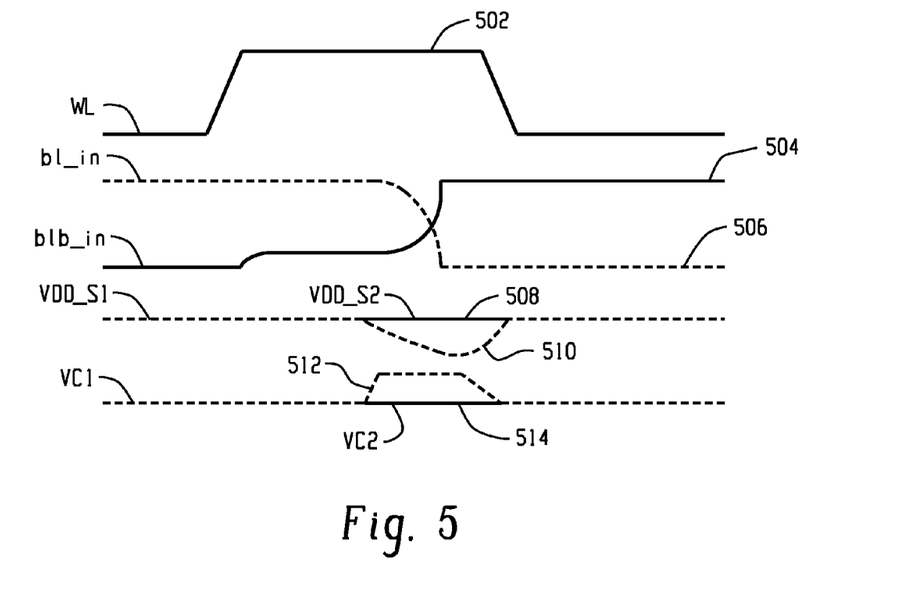
FIG. 5 depicts an example timing diagram for the SRAM cell as shown in FIG. 2 in a write-enable mode.

FIG. 5 depicts an example timing diagram for the SRAM cell 200 in a write-enable mode. As shown in FIG. 5, the local supply voltage 238 ("VDD_S1") is reduced (e.g., as shown by a waveform 510) to assist writing a logic value "0" to the node 304.

Specifically, the word-line signal 302 ("WL") changes from logic low to logic high to turn on the pass-gate transistors 214 and 216, as shown by a waveform 502. For example, the bit line 234 ("bl_in") is gradually pulled low (e.g., as shown by a waveform 506), while the bit line 236 ("blb_in") is gradually pulled high (e.g., as shown by a waveform 504), so that a new data bit can be written to the SRAM cell 200.

The bias voltage 230 ("VC1") changes from logic low to logic high (e.g., as shown by a waveform 512), and the bias voltage 232 ("VC2") remains at logic low (e.g., as shown by a waveform 514). Consequently, the transistor 202 is turned off, and the transistor 204 remains on. In turn, the local supply voltage 238 ("VDD_S1") decreases (e.g., as shown by the waveform 510), and the local supply voltage 240 ("VDD_S2") does not change much (e.g., as shown by a waveform 508). Eventually, a logic value "0" is written to the node 304, and a logic value "1" is written to the node 306.

Figure 6:
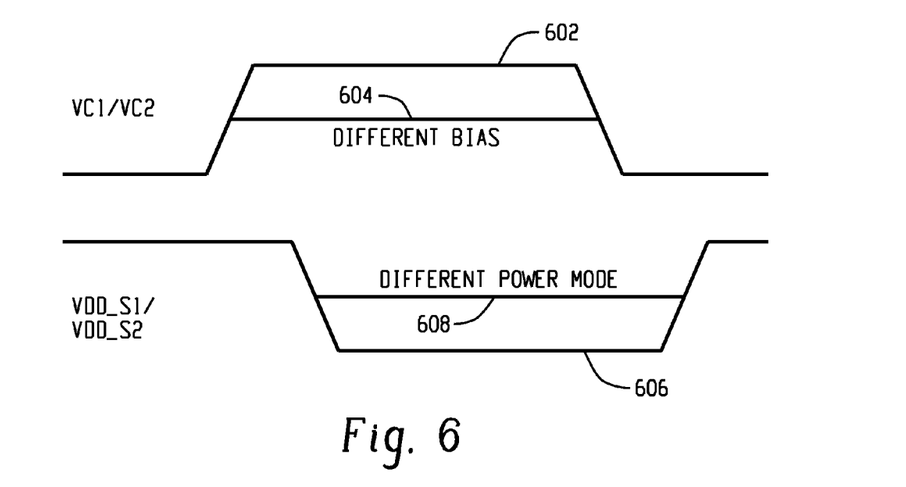
FIG. 6 depicts an example timing diagram for the SRAM cell as shown in FIG. 2 in a power-down mode.

FIG. 6 depicts an example timing diagram for the SRAM cell 200 in a power-down mode. As shown in FIG. 6, when the SRAM cell 200 changes from a normal-operation mode (e.g., a read mode, a write-enable mode) to a power-down mode, the bias voltage 230 ("VC1") and/or the bias voltage 232 ("VC2") decrease from a magnitude 602 to another magnitude 604, and the local supply voltage 238 ("VDD_S1") and/or the local supply voltage 240 ("VDD_S2") decrease from a magnitude 606 to another magnitude 608 in order to reduce power consumption during the power-down mode.

Figure 7:
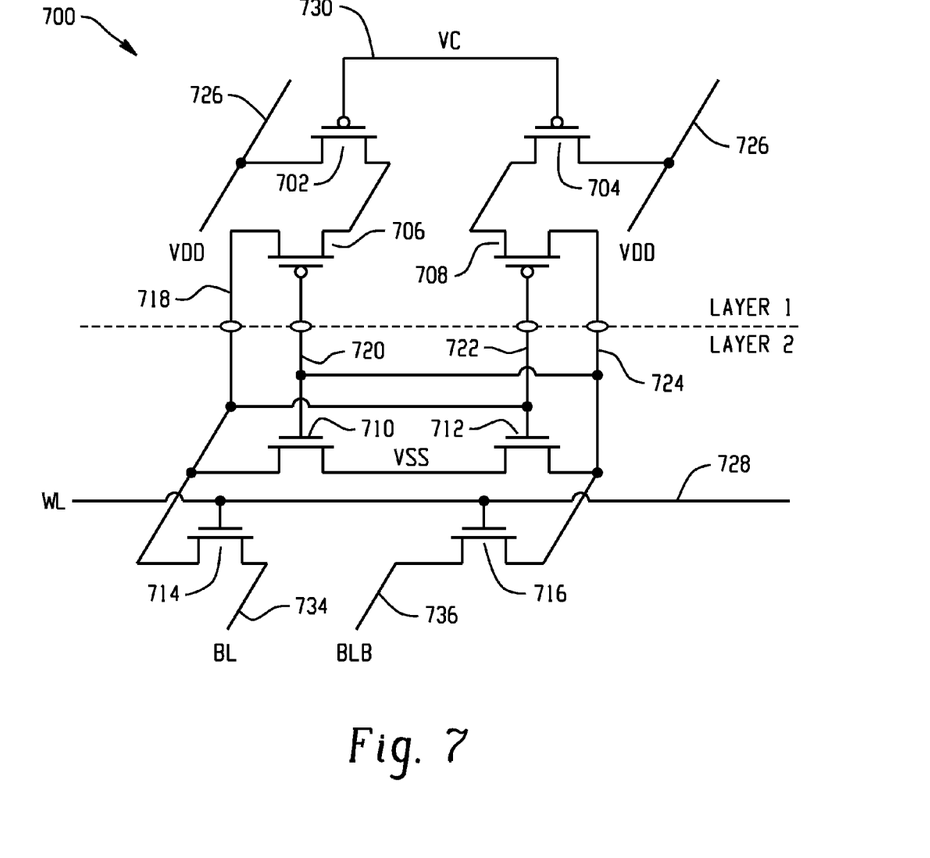
FIG. 7 depicts another example diagram of an eight-transistor (8-T) SRAM cell fabricated using a multi-layer semiconductor device structure.

FIG. 7 depicts another example diagram of an eight-transistor (8-T) SRAM cell fabricated using a multi-layer semiconductor device structure. As shown in FIG. 7, the SRAM cell 700 includes eight transistors 702, 704, 706, 708, 710, 712, 714 and 716, where the transistors 702, 704, 706 and 708 (e.g., P-channel transistors) are fabricated in a first device layer ("Layer 1") and the transistors 710, 712, 714 and 716 (e.g., N-channel transistors) are fabricated in a second device layer ("Layer 2"). Certain inter-layer connection structures (e.g., vias) 718, 720, 722, and 724 are fabricated to connect the pull-up transistors 706 and 708 and the pull-down transistors 710 and 712 in cross-coupled inverter configuration.

As shown in FIG. 7, a word line 728 provides control signals to gate terminals of the pass-gate transistors 714 and 716. A pair of complementary bit lines 734 and 736 are coupled to source/drain terminals of the pass-gate transistors 714 and 716 respectively. A global supply voltage 726 ("VDD") is provided to the operation-assistance transistors 702 and 704 which both receive a bias voltage 730 ("VC") at their respective gate terminals. As an example, the bias voltage 730 is equal to or lower than the global supply voltage 726.

Figure 8:
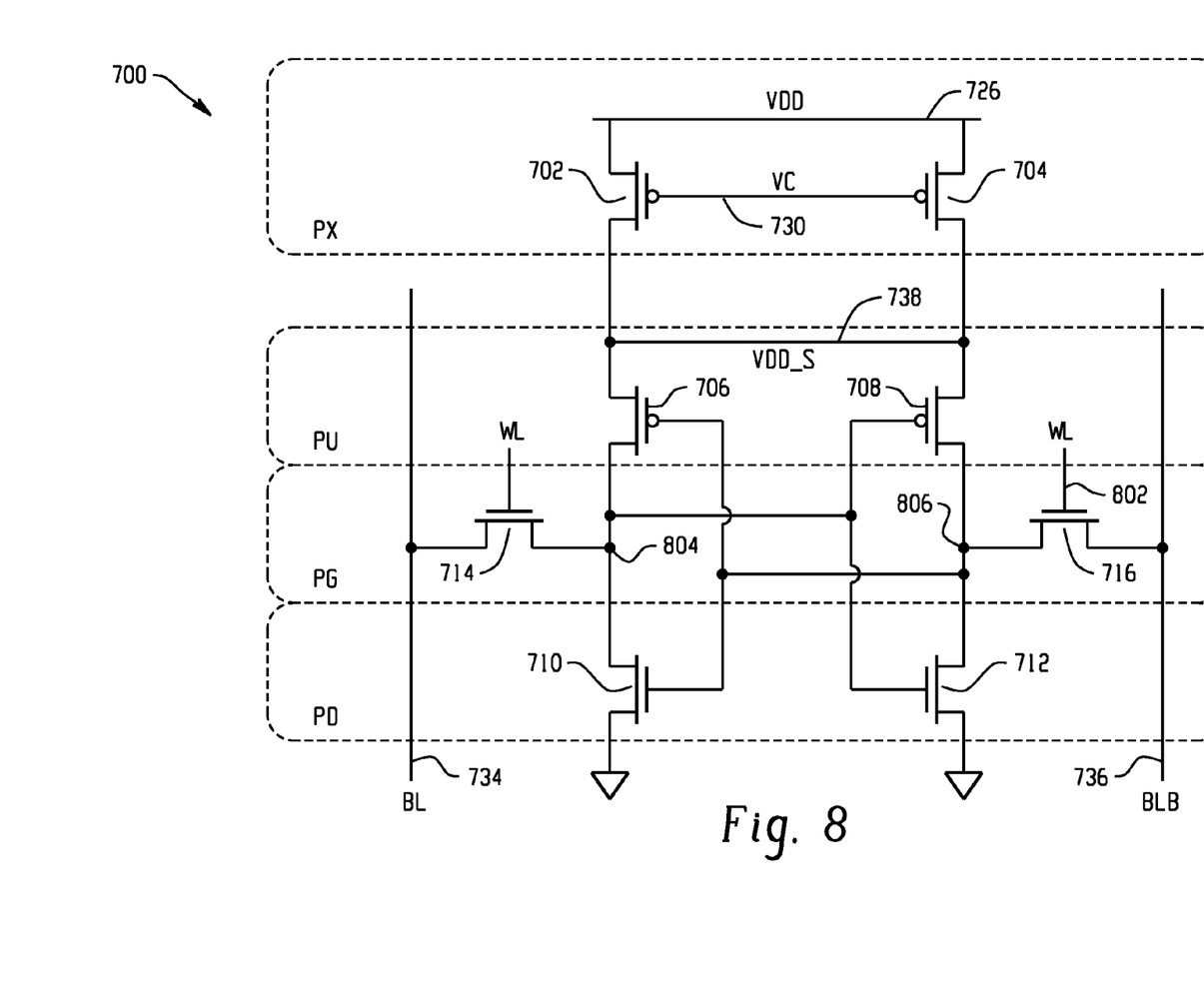
FIG. 8 depicts an example schematic diagram of the SRAM cell as shown in FIG. 7.

FIG. 8 depicts an example schematic diagram of the SRAM cell 700. The transistors 702 and 704 are configured to receive the global supply voltage 726 ("VDD") and the common bias voltage 730 ("VCC") and provide a local supply voltage 738 ("VDD_S") to the pull-up transistors 706 and 708. If the common bias voltage 730 that is applied on the gate terminals of the transistors 702 and 704 changes, the local supply voltage 738 may change in response. For example, when the transistors 702 and 704 are turned on in response to the bias voltage 730 (e.g., at logic low), the local supply voltage 738 decreases in magnitude if the bias voltage 730 decreases in magnitude.

Figure 9:
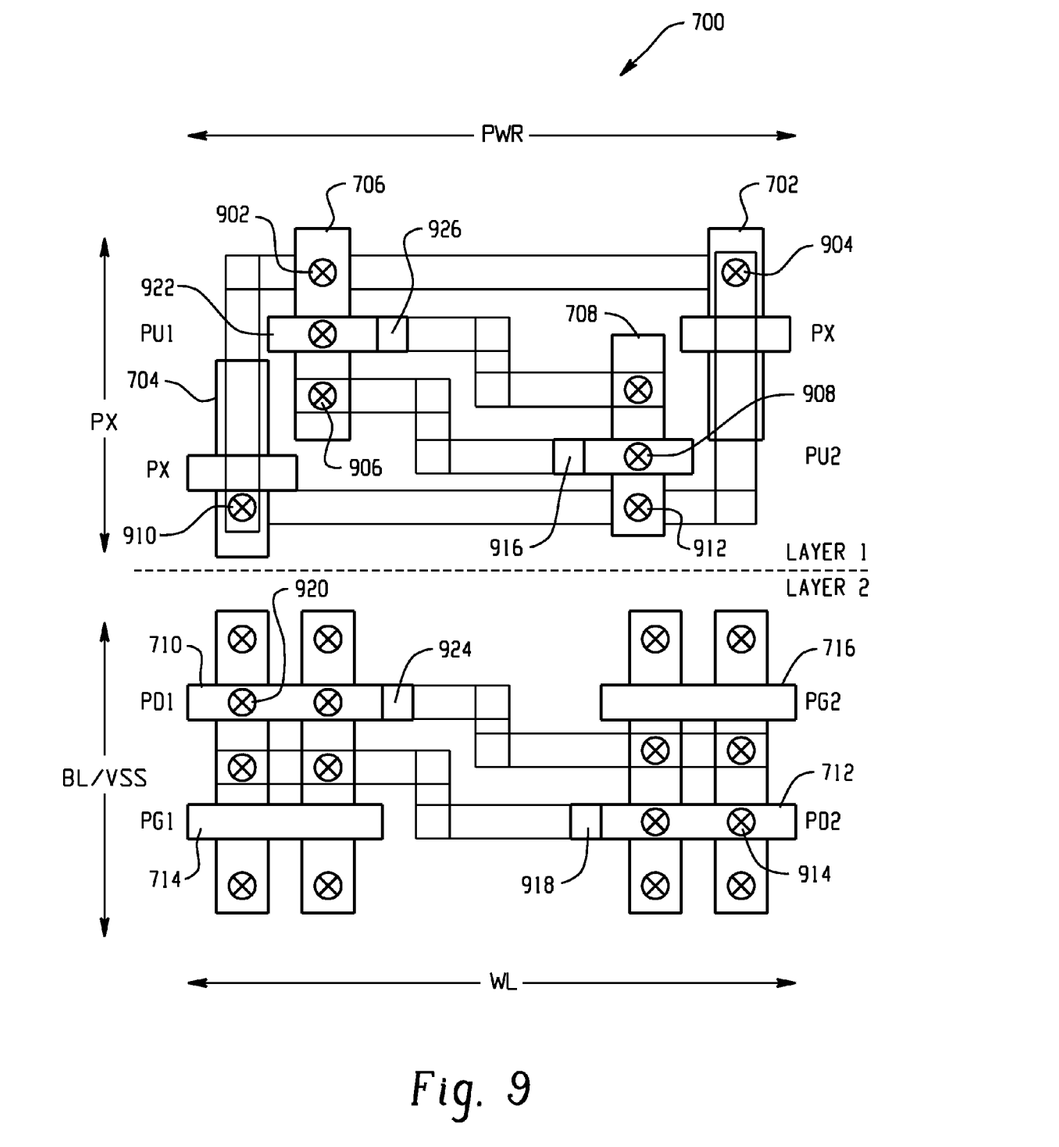
FIG. 9 depicts an example layout diagram of the SRAM cell as shown in FIG. 7.

FIG. 9 depicts an example layout diagram of the SRAM cell 700. As shown in FIG. 9, the first device layer ("Layer 1") includes the transistors 702, 704, 706 and 708 which are interconnected. For example, a source/drain terminal 902 of the transistor 706 ("PU1") is connected to a source/drain terminal 904 of the transistor 702, and another source/drain terminal 906 of the transistor 706 is connected to a gate terminal 908 of the transistor 708 ("PU2"). A source/drain terminal 910 of the transistor 704 is connected to another source/drain terminal 912 of the transistor 708. Further, the second device layer ("Layer 2") includes the transistors 710, 712, 714 and 716 which are also interconnected. As an example, a gate terminal 914 of the transistor 712 ("PD2") is connected to the gate terminal 908 of the transistor 708 ("PU2") through one or more inter-layer connection structures (e.g., vias 916 and 918). A gate terminal 920 of the transistor 710 ("PD1") is connected to a gate terminal 922 of the transistor 706 ("PU1") through one or more inter-layer connection structures (e.g., vias 924 and 926).

In some embodiments, a conductive line ("PWR") corresponding to the global supply voltage 726 ("VDD") is fabricated in the first device layer ("Layer 1"). A conductive line ("PX") corresponding to the bias voltage 730 ("VC") is fabricated in the first device layer ("Layer 1"). One or more conductive lines ("BL/VSS") corresponding to the bit line 734, the bit line 736 and/or a global bias voltage "VSS" are fabricated in the second device layer ("Layer 2"). A conductive line ("WL") corresponding to the word line 728 is also fabricated in the second device layer ("Layer 2"). For example, the conductive line "PWR" is along a same direction as the conductive line "WL." The conductive line "PX" is along a same direction as the conductive lines "BL/VSS."

Referring to FIG. 7 and FIG. 8, the SRAM cell 700 may be in a normal-operation mode, e.g., a read mode, or a write-enable mode. In certain embodiments, when the SRAM cell 700 is in a read mode, the transistors 702 and 704 are turned on in response to the common bias voltage 730 (e.g., at logic low). A word-line signal 802 turns on the pass-gate transistors 714 and 716. A data bit stored in the SRAM cell 700 may be transferred to the bit lines 734 and 736. For example, if a node 804 holds a logic value "0" and a node 806 holds a logic value "1," the bit line 734 may be discharged through the pass-gate transistor 714 and the pull-down transistor 710 to have the logic value "0," and the bit line 736 may be pulled to the logic value "1" through the pass-gate transistor 716 and the pull-up transistor 708.

Figure 10:
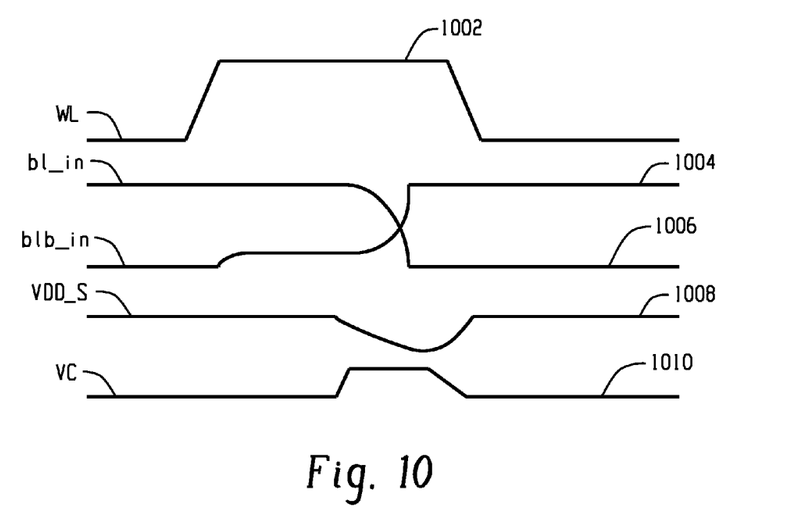
FIG. 10 depicts an example timing diagram for the SRAM cell as shown in FIG. 7 in a write-enable mode.

FIG. 10 depicts an example timing diagram for the SRAM cell 700 in a write-enable mode. As shown in FIG. 10, the local supply voltage 738 ("VDD_S") is reduced (e.g., as shown by a waveform 1008) to assist writing a logic value "0" to the node 804.

Specifically, the word-line signal 802 ("WL") changes from logic low to logic high to turn on the pass-gate transistors 714 and 716, as shown by a waveform 1002. For example, the bit line 734 ("bl_in") is gradually pulled low (e.g., as shown by a waveform 1006), while the bit line 736 ("blb_in") is gradually pulled high (e.g., as shown by a waveform 1004), so that a new data bit can be written to the SRAM cell 700. The common bias voltage 730 ("VC") changes from logic low to logic high (e.g., as shown by a waveform 1010), and consequently, the transistors 702 and 704 are turned off. In turn, the local supply voltage 738 ("VDD_S") decreases (e.g., as shown by a waveform 1008). Eventually, a logic value "0" is written to the node 804, and a logic value "1" is written to the node 806.

Figure 11:
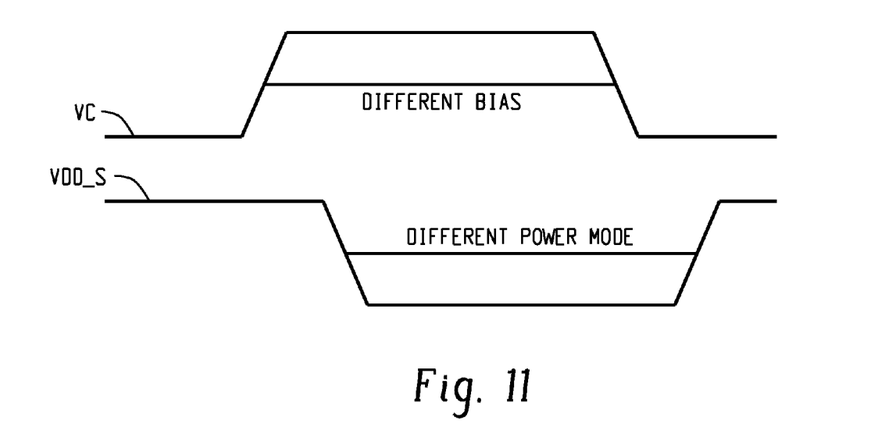
FIG. 11 depicts an example timing diagram for the SRAM cell as shown in FIG. 7 in a power-down mode.

FIG. 11 depicts an example timing diagram for the SRAM cell 200 in a power-down mode. Similar to what is shown in FIG. 6, when the SRAM cell 700 changes from a normal-operation mode (e.g., a read mode, a write-enable mode) to a power-down mode, the bias voltage 730 ("VC") decreases in magnitude, and the local supply voltage 738 ("VDD_S") decreases in magnitude so that power consumption during the power-down mode may be reduced.

In some embodiments, the SRAM cell 200 as shown in FIG. 4 and/or the SRAM cell 700 as shown in FIG. 9 have a smaller layout size compared with a typical layout for the SRAM cell 100. Particularly, the SRAM cell 200 as shown in FIG. 4 and/or the SRAM cell 700 as shown in FIG. 9 has a shorter word line, which may reduce resistance and thus improve performance.

Figure 12:
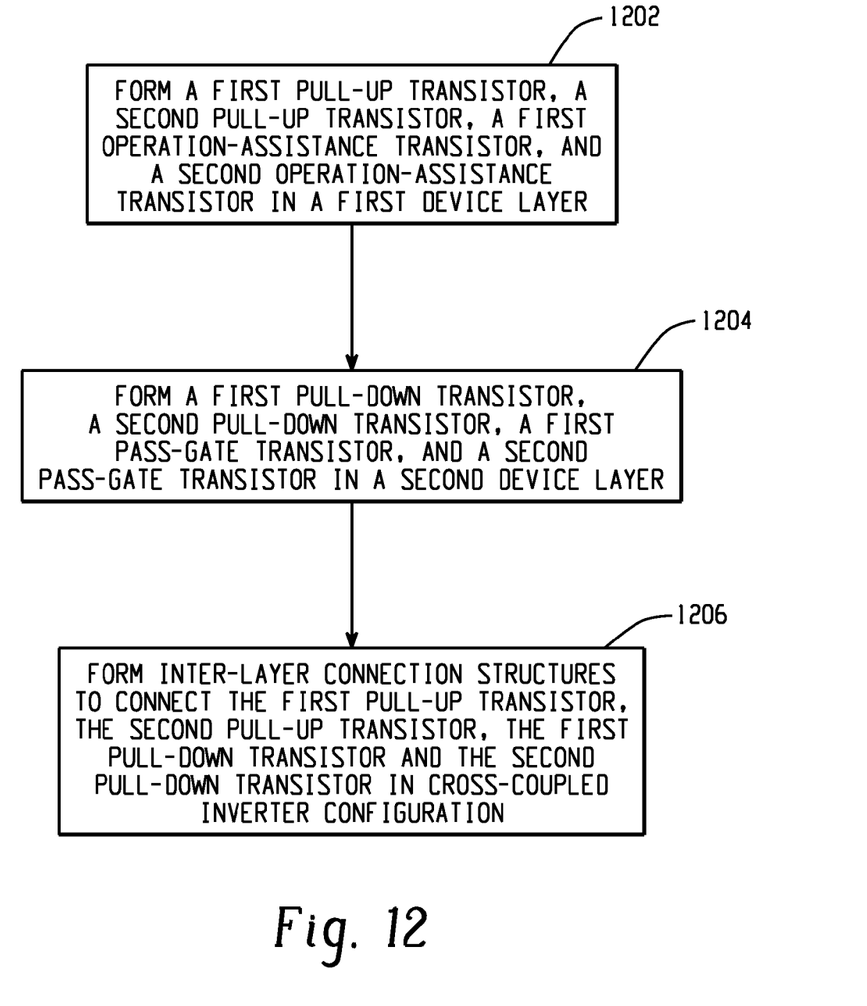
FIG. 12 depicts an example flow chart for fabricating a static random access memory (SRAM) cell in a multi-layer semiconductor device structure.

FIG. 12 depicts an example flow chart for fabricating a SRAM cell in a multi-layer semiconductor device structure. At 1202, a first pull-up transistor, a second pull-up transistor, a first operation-assistance transistor, and a second operation-assistance transistor are formed in a first device layer of a multi-layer semiconductor device structure. The first operation-assistance transistor and the second operation-assistance transistor are coupled to the first pull-up transistor and the second pull-up transistor respectively. At 1204, a first pull-down transistor, a second pull-down transistor, a first pass-gate transistor, and a second pass-gate transistor are formed in a second device layer of the multi-layer semiconductor device structure. The first pass-gate transistor and the second pass-gate transistor are coupled to the first pull-down transistor and the second pull-down transistor respectively. At 1206, one or more inter-layer connection structures are formed to connect the first pull-up transistor, the second pull-up transistor, the first pull-down transistor and the second pull-down transistor in cross-coupled inverter configuration.

This written description uses examples to disclose embodiments of the disclosure, include the best mode, and also to enable a person of ordinary skill in the art to make and use various embodiments of the disclosure. The patentable scope of the disclosure may include other examples that occur to those of ordinary skill in the art. One of ordinary skill in the relevant art will recognize that the various embodiments may be practiced without one or more of the specific details, or with other replacement and/or additional methods, materials, or components. Further, persons of ordinary skill in the art will recognize various equivalent combinations and substitutions for various components shown in the figures. For example, certain transistors are described herein as examples, and the concepts, structures, layouts, materials, or operations may also be applicable to other types of semiconductor devices, such as bipolar junction transistors, diodes, capacitors, etc. As an example, the structures, layouts, materials, operations, voltage levels, or current levels related to "source" and "drain" described herein (including in the claims) may be interchangeable as a result of transistors with "source" and "drain" being symmetrical devices.

Well-known structures, materials, or operations may not be shown or described in detail to avoid obscuring aspects of various embodiments of the disclosure. Various embodiments shown in the figures are illustrative example representations and are not necessarily drawn to scale. Particular features, structures, materials, or characteristics may be combined in any suitable manner in one or more embodiments. The present disclosure may repeat reference numerals and/or letters in the various examples, and this repetition is for the purpose of simplicity and clarity and does not in itself dictate a relationship between the various embodiments and/or configurations discussed. Various additional layers and/or structures may be included and/or described features may be omitted in other embodiments. Various operations may be described as multiple discrete operations in turn, in a manner that is most helpful in understanding the disclosure. However, the order of description should not be construed as to imply that these operations are necessarily order dependent. In particular, these operations need not be performed in the order of presentation. Operations described herein may be performed in a different order, in series or in parallel, than the described embodiments. Various additional operations may be performed and/or described. Operations may be omitted in additional embodiments.

This written description and the following claims may include terms, such as "on," that are used for descriptive purposes only and are not to be construed as limiting. The embodiments of a device or article described herein can be manufactured, used, or shipped in a number of positions and orientations. For example, the term "on" as used herein (including in the claims) may not necessarily indicate that a first layer/structure "on" a second layer/structure is directly on and in immediate contact with the second layer/structure unless such is specifically stated; there may be one or more third layers/structures between the first layer/structure and the second layer/structure. The term "semiconductor device structure" used herein (including in the claims) may refer to shallow trench isolation features, poly-silicon gates, lightly doped drain regions, doped wells, contacts, vias, metal lines, or other types of circuit patterns or features to be formed on a semiconductor substrate.

What is claimed is:

1. A static random access memory (SRAM) cell fabricated in a multi-layer semiconductor device structure, comprising:
    a first pull-up transistor and a second pull-up transistor formed in a first device layer of a multi-layer semiconductor device structure;
    a first pull-down transistor and a second pull-down transistor formed in a second device layer of the multi-layer semiconductor device structure, the first pull-up transistor, the second pull-up transistor, the first pull-down transistor and the second pull-down transistor being in cross-coupled inverter configuration for storing a data bit;
    a plurality of operation-assistance transistors formed in the first device layer and configured to provide local supply voltages to the first pull-up transistor and the second pull-up transistor; and
    a first pass-gate transistor and a second pass-gate transistor formed in the second device layer and configured to provide access to the data bit.

2. The SRAM cell of claim 1, wherein:
    the plurality of operation-assistance transistors include a first operation-assistance transistor and a second operation-assistance transistor;
    the first operation-assistance transistor is configured to be turned on or off in response to a first bias voltage; and
    the second operation-assistance transistor is configured to be turned on or off in response to a second bias voltage.

3. The SRAM cell of claim 2, wherein in a read mode,
    the first operation-assistance transistor is further configured to be turned on in response to the first bias voltage;
    the second operation-assistance transistor is further configured to be turned on in response to the second bias voltage; and
    the first pass-gate transistor and the second pass-gate transistor are further configured to, in response to a word-line signal, provide one or more output signals associated with the data bit to one or more bit lines.

4. The SRAM cell of claim 2, wherein in a write-enable mode,
    the first operation-assistance transistor is further configured to be turned off in response to the first bias voltage;
    the second operation-assistance transistor is further configured to be turned on in response to the second bias voltage; and
    the first pass-gate transistor and the second pass-gate transistor are further configured to, in response to a word-line signal, provide one or more input signals from one or more bit lines to the first pull-up transistor, the second pull-up transistor, the first pull-down transistor and the second pull-down transistor to write a new data bit.

5. The SRAM cell of claim 2, wherein in a power-down mode, the first operation-assistance transistor is further configured to, in response to the first bias voltage changing, decrease a first local supply voltage provided to the first pull-up transistor.

6. The SRAM cell of claim 2, wherein:
a first gate terminal of the first operation-assistance transistor is configured to receive the first bias voltage;
a first source terminal of the first operation-assistance transistor is configured to receive a global supply voltage;
a first drain terminal of the first operation-assistance transistor is configured to provide a first local supply voltage to the first pull-up transistor;
a second gate terminal of the second operation-assistance transistor is configured to receive the second bias voltage;
a second source terminal of the second operation-assistance transistor is configured to receive the global supply voltage; and
a second drain terminal of the second operation-assistance transistor is configured to provide a second local supply voltage to the second pull-up transistor.

7. The SRAM cell of claim 1, wherein:
the plurality of operation-assistance transistors include a first operation-assistance transistor and a second operation-assistance transistor; and
the first operation-assistance transistor and the second operation-assistance transistor are configured to be turned on or off in response to a common bias voltage.

8. The SRAM cell of claim 7, wherein in a read mode,
the first operation-assistance transistor and the second operation-assistance transistor are further configured to be turned on in response to the common bias voltage; and
the first pass-gate transistor and the second pass-gate transistor are further configured to, in response to a word-line signal, provide one or more output signals associated with the data bit to one or more bit lines.

9. The SRAM cell of claim 7, wherein in a write-enable mode,
the first operation-assistance transistor and the second operation-assistance transistor are further configured to be turned off in response to the common bias voltage; and
the first pass-gate transistor and the second pass-gate transistor are further configured to, in response to a word-line signal, provide one or more input signals from one or more bit lines to the first pull-up transistor, the second pull-up transistor, the first pull-down transistor and the second pull-down transistor to write a new data bit.

10. The SRAM cell of claim 7, wherein in a power-down mode, the first operation-assistance transistor and the second operation-assistance transistor are further configured to, in response to the common bias voltage changing, decrease a common local supply voltage provided to the first pull-up transistor and the second pull-up transistor.

11. The SRAM cell of claim 1, wherein:
a first gate terminal of the first pass-gate transistor and a second gate terminal of the second pass-gate transistor are coupled to a word line;
a first source terminal of the first pass-gate transistor is coupled to a first bit line;
a second source terminal of the second pass-gate transistor is coupled to a second bit line; and
the word line, the first bit line and the second bit line are formed in the second device layer.

12. The SRAM cell of claim 1, wherein:
a first drain terminal of the first pull-up transistor is coupled to a second drain terminal of the first pull-down transistor;
a first gate terminal of the first pull-up transistor is coupled to a second gate terminal of the first pull-down transistor;
a third drain terminal of the second pull-up transistor is coupled to a fourth drain terminal of the second pull-down transistor; and
a third gate terminal of the second pull-up transistor is coupled to a fourth gate terminal of the second pull-down transistor.

13. The SRAM cell of claim 1, wherein:
the first pull-up transistor and the second pull-up transistor are p-channel transistors;
the first pull-down transistor, the second pull-down transistor, the first pass-gate transistor, and the second pass-gate transistor are n-channel transistors; and
the plurality of operation-assistance transistors include one or more p-channel transistors.

14. A static random access memory (SRAM) cell fabricated in a multi-layer semiconductor device structure, comprising:
a first inverter structure including one or more first pull-up transistors and one or more first pull-down transistors;
a second inverter structure including one or more second pull-up transistors and one or more second pull-down transistors, the first inverter structure and the second inverter structure being cross-coupled for storing a data bit;
a local-supply-voltage generator including one or more operation-assistance transistors and configured to provide local supply voltages to the first inverter structure and the second inverter structure; and
an access device structure including one or more pass-gate transistors and configured to provide access to the data bit;
wherein:
the first pull-up transistors, the second pull-up transistors, and the operation-assistance transistors are formed in a first device layer of a multi-layer semiconductor device structure;
the first pull-down transistors and the second pull-down transistors are formed in a second device layer of the multi-layer semiconductor device structure; and
the first inverter structure and the second inverter structure are coupled to the access device structure.

15. The SRAM cell of claim 14, wherein:
the one or more operation-assistance transistors include a first operation-assistance transistor and a second operation-assistance transistor;
the first operation-assistance transistor is configured to be turned on or off in response to a first bias voltage; and
the second operation-assistance transistor is configured to be turned on or off in response to a second bias voltage.

16. The SRAM cell of claim 15, wherein in a read mode,
the first operation-assistance transistor is further configured to be turned on in response to the first bias voltage;
the second operation-assistance transistor is further configured to be turned on in response to the second bias voltage; and
the access device structure is further configured to, in response to a word-line signal, provide one or more output signals associated with the data bit to one or more bit lines.

17. The SRAM cell of claim 15, wherein in a write-enable mode,
the first operation-assistance transistor is further configured to be turned off in response to the first bias voltage;
the second operation-assistance transistor is further configured to be turned on in response to the second bias voltage; and
the access device structure is further configured to, in response to a word-line signal, provide one or more input signals from one or more bit lines to the first inverter structure and the second inverter structure to write a new data bit.

18. The SRAM cell of claim 15, wherein in a power-down mode, the first operation-assistance transistor is further configured to, in response to the first bias voltage changing, decrease a first local supply voltage provided to the first inverter structure.

19. A static random access memory (SRAM) cell fabricated in a multi-layer semiconductor device structure, comprising:
a first pull-up transistor and a second pull-up transistor formed in a first device layer of a multi-layer semiconductor device structure;
a first operation-assistance transistor formed in the first device layer and coupled to the first pull-up transistor;
a second operation-assistance transistor formed in the first device layer and coupled to the second pull-up transistor;
a power line formed in the first device layer and configured to provide a supply voltage to the first operation-assistance transistor and the second operation-assistance transistor;
one or more bias voltage lines formed in the first device layer and configured to provide gate-bias voltages to the first operation-assistance transistor and the second operation-assistance transistor;
a first pull-down transistor and a second pull-down transistor formed in a second device layer of the multi-layer semiconductor device structure, the first pull-up transistor, the second pull-up transistor, the first pull-down transistor and the second pull-down transistor being in cross-coupled inverter configuration for storing a data bit;
a first pass-gate transistor and a second pass-gate transistor formed in the second device layer and configured to provide access to the data bit;
a word line formed in the second device layer and configured to provide a word-line signal to the first pass-gate transistor and the second pass-gate transistor; and
one or more bit lines formed in the second device layer and configured to provide input signals to the first pass-gate transistor and the second pass-gate transistor and receive output signals from the first pass-gate transistor and the second pass-gate transistor.

20. The SRAM cell of claim 19, wherein:
the word line is along a same direction as the power line; and
the bias voltage lines are along a same direction as the bit lines.

\* \* \* \* \*